(12) United States Patent
Sun

(10) Patent No.: US 10,048,579 B2
(45) Date of Patent: *Aug. 14, 2018

(54) MASK PLATE, PHOTO-ALIGNMENT METHOD AND LIQUID CRYSTAL DISPLAY DEVICE

(71) Applicant: Shenzhen China Star Optoelectronics Technology Co., Ltd., Shenzhen, Guangdong (CN)

(72) Inventor: Jie Sun, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/588,979

(22) Filed: May 8, 2017

(65) Prior Publication Data

US 2017/0242334 A1    Aug. 24, 2017

Related U.S. Application Data

(62) Division of application No. 14/436,450, filed on Apr. 16, 2015, now Pat. No. 9,678,390.

(30) Foreign Application Priority Data

Dec. 26, 2014    (CN) .......................... 2014 1 0829680

(51) Int. Cl.
G03F 1/38      (2012.01)
G02F 1/1337    (2006.01)

(52) U.S. Cl.
CPC .......... *G03F 1/38* (2013.01); *G02F 1/133788* (2013.01)

(58) Field of Classification Search
CPC ......... G02F 1/133788; G02F 1/134309; G02F 2001/134345; G02F 1/1337;
(Continued)

(56) References Cited

U.S. PATENT DOCUMENTS 8,830,427 B2     9/2014  Jeong
2004/0266146 A1* 12/2004 Jung ................... H01L 21/2026
                                                    438/487
(Continued)

FOREIGN PATENT DOCUMENTS

CN    103105702 A    5/2013
CN    103257480 A    8/2013
(Continued)

OTHER PUBLICATIONS

English translation of CN 103984202 A, Title: Masking plate and color film substrate manufacturing method, Author: Wang Dong; Date of publication: Aug. 13, 2014.*

*Primary Examiner* — Edward Glick
*Assistant Examiner* — Shan Liu
(74) *Attorney, Agent, or Firm* — Andrew C. Cheng

(57) ABSTRACT

The disclosure is related to a photo-alignment method, comprising the following steps. A top panel and a bottom panel each with an alignment film are provided; a mask plate for shielding the top panel and the bottom panel is provided, and a transparent section of the mask plate is disposed; an ultraviolet is emitted along a first incident direction by the mask plate for exposing the alignment film of the top panel and the bottom panel; the transparent section of the mask plate is adjusted, an ultraviolet is emitted along a second incident direction by the mask plate for exposing the alignment film of the top panel and the bottom panel. The manufacture of the alignment film in the whole liquid crystal display device can be accomplished by a mask plate under- (Continued)

going exposure twice, so that the exposure times decrease and the process is simplified.

1 Claim, 8 Drawing Sheets

(58) Field of Classification Search
CPC .......... G02F 1/13378; G02F 1/133707; G02F 1/133753; G02F 1/133784; G02F 1/3775; G02F 1/0027; G02F 1/141; G02F 1/133719; G02F 2001/133738; G02F 2001/133769; G02F 2001/133776; G02F 2001/13787; G02F 2001/133746; G02F 2001/133749; G02F 2001/133773; G02F 2001/3548; G02F 2001/133742; G02F 2001/133761; G02F 1/1303; G02F 1/133351; G02F 1/13; G02F 1/0018; G02F 1/133365; G02F 2001/13775; G02F 2202/00; G02F 2202/02; G02F 2202/021; G02F 2202/022; G02F 2202/023; G02F 2202/025; G02F 2202/20; G02F 2202/30; G02F 2202/34; G02F 2202/36; G02F 2202/42; G02F 1/133711; G02F 1/133703; G02F 2001/133715; G02F 2001/133726; G02F 2001/133796; G02F 1/133734; G02F 1/3365; G03F 1/00; G03F 7/2022; G03F 1/38; G03F 1/0007; G03F 1/0015; G03F 1/0023; G03F 1/003; G03F 1/0038; G03F 1/0046; G03F 1/0053; G03F 1/0061; G03F 1/0069; G03F 1/0076; G03F 1/0084; G03F 1/0092; G03F 1/02; G03F 1/04; G03F 1/06; G03F 1/08; G03F 1/10; G03F 1/103; G03F 1/106; G03F 1/12; G03F 1/14; G03F 1/142; G03F 1/144; G03F 1/146; G03F 1/148; G03F 1/16; G03F 1/20; G03F 1/22; G03F 1/24; G03F 1/26; G03F 1/28; G03F 1/29; G03F 1/30; G03F 1/32; G03F 1/34; G03F 1/36; G03F 1/40; G03F 1/42; G03F 1/44; G03F 1/46; G03F 1/48; G03F 1/50; G03F 1/52; G03F 1/54; G03F 1/56; G03F 1/58; G03F 1/60; G03F 1/62; G03F 1/64; G03F 1/66; G03F 1/68; G03F 1/70; G03F 1/72; G03F 1/74; G03F 1/76; G03F 1/78; G03F 1/80; G03F 1/82; G03F 1/84; G03F 1/86; G03F 1/88; G03F 1/90; G03F 1/92; G09G 2300/0495; G09G 2300/0486; H01L 21/02211; H05K 3/389; C08F 259/08; C09K 2019/548; C09K 19/04; C09K 19/56; C09K 19/38; Y10T 428/10; Y10T 428/1005; Y10T 428/1009; B32B 17/10504; B32B 2457/202; B32B 2305/55
USPC ......... 349/123–136, 187; 428/1.1, 1.2, 1.21; 430/5
See application file for complete search history.

(56) References Cited

U.S. PATENT DOCUMENTS

| | | | | |
|---|---|---|---|---|
| 2010/0085524 A1* | 4/2010 | Nakagawa | ........ | G02F 1/133753 349/124 |
| 2010/0261105 A1* | 10/2010 | Ahn | ................. | G02F 1/133516 430/20 |
| 2012/0308936 A1* | 12/2012 | Cho | .......................... | G03F 1/00 430/319 |
| 2013/0003033 A1* | 1/2013 | Lee | ....................... | G03F 7/2022 355/67 |
| 2014/0205935 A1* | 7/2014 | Chiang | .................... | G03F 1/50 430/5 |
| 2016/0355923 A1* | 12/2016 | Mu | ....................... | C23C 14/042 |

FOREIGN PATENT DOCUMENTS

| | | | |
|---|---|---|---|
| CN | 103336389 A | | 10/2013 |
| CN | 103869547 A | | 6/2014 |
| CN | 103984202 A | * | 8/2014 |
| CN | 104102094 A | | 10/2014 |
| CN | 104238195 A | | 12/2014 |

* cited by examiner

MASK PLATE, PHOTO-ALIGNMENT METHOD AND LIQUID CRYSTAL DISPLAY DEVICE

CROSS REFERENCE TO RELATED APPLICATIONS

This is a divisional application of co-pending patent application Ser. No. 14/436,450, filed on Apr. 16, 2015, which is a national stage of PCT Application Number PCT/CN2015/070607, filed on Jan. 13, 2015, claiming foreign priority of Chinese Patent Application Number 201410829680.8, filed on Dec. 26, 2014.

BACKGROUND OF THE INVENTION

1. Field of the Invention

The disclosure is related the field of liquid crystal, and more particularly, to a mask plate, a photo-alignment method using the same and a liquid crystal display device.

2. Description of Related Art

In general, the most common alignment technology in manufacturing liquid crystal displays is rubbing alignment. By this method, liquid crystal molecules have better performance of alignment. However, during rubbing, static electricity and pollution generated by particles would occur because of the rubbing villus, which causes the damage of the liquid crystal units.

Currently, another photo alignment method is used. In this method, a linearly-polarized ultraviolet is irradiated to a polymer alignment film having sensitizer, so that the polymers are aligned. The advantage of this method is that the method can avoid the pollution on the surface of the glass substrate, alignment with a small area is feasible, alignment with patterns can be achieved by a photo mask, the properties of the liquid crystal unit, such as the pre-inclined angle, the strength of the surface orientation, can be controlled by the incident angle of the light and the exposure time.

However, in this method, when forming a plurality of regions having the same alignment in a plurality of sections in a pixel for increasing the side visibility, a plurality of photo masks is needed. In addition, the method needs to comprise a plurality of steps for irradiating light with different directions. Thus, the method is complicated and the cost is expensive.

SUMMARY OF THE INVENTION

The embodiment of the disclosure provides a mask plate and a photo-alignment method for aligning a liquid crystal display device using the mask plate.

A photo-alignment method comprises the following steps:
providing a top panel and a bottom panel;
providing a mask plate for shielding the top panel and the bottom panel, and disposing a transparent section of the mask plate;
emitting an ultraviolet along a first incident direction by the mask plate for exposing a top alignment film of the top panel and a bottom alignment film of the bottom panel;
adjusting the transparent section of the mask plate; and
emitting an ultraviolet along a second incident direction by the mask plate for exposing a top alignment film of the top panel and a bottom alignment film of the bottom panel.

Moreover, in the step of providing a top panel and a bottom panel, the photo-alignment method further comprises:

dividing a high gray scale sub pixel at the bottom panel into a first high gray scale sub pixel section and a second high gray scale sub pixel section, wherein the first high gray scale sub pixel section is adjacent to the second high gray scale sub pixel section, and the first high gray scale sub pixel section and the second high gray scale sub pixel section are disposed along a long edge of a pixel, and dividing a low gray scale sub pixel at the bottom panel into a first low gray scale sub pixel section and a second low gray scale sub pixel section, wherein the first low gray scale sub pixel section is adjacent to the second low gray scale sub pixel section, and the first low gray scale sub pixel section and the second low gray scale sub pixel section are disposed along a long edge of a pixel;

dividing a high gray scale sub pixel at the top panel into a first high gray scale sub pixel section and a second high gray scale sub pixel section, wherein the first high gray scale sub pixel section is adjacent to the second high gray scale sub pixel section, and the first high gray scale sub pixel section and the second high gray scale sub pixel section are disposed along a short edge of a pixel, and dividing a low gray scale sub pixel at the top panel into a first low gray scale sub pixel section and a second low gray scale sub pixel section, wherein the first low gray scale sub pixel section is adjacent to the second low gray scale sub pixel section, and the first low gray scale sub pixel section and the second low gray scale sub pixel section are disposed along a short edge of a pixel; and disposing the top panel and the bottom panel so that the top panel and the bottom panel being vertical to each other.

Moreover, in the step of providing a mask plate for shielding the top panel and the bottom panel, and disposing a transparent section of the mask plate, the photo-alignment method further comprises:

exposing a first transparent section of the mask plate and disposing the first transparent section of the mask plate corresponding to the first high gray scale sub pixel section of the bottom panel; a first shield plate of the mask plate shielding a second transparent section of a first opening;

exposing a third transparent section of the mask plate and disposing the third transparent section of the mask plate corresponding to the first low gray scale sub pixel section of the bottom panel; a second shield plate of the mask plate shielding a fourth transparent section of a second opening;

exposing a fifth transparent section of the mask plate and disposing the fifth transparent section of the mask plate corresponding to the first high gray scale sub pixel section of the top panel; a third shield plate of the mask plate shielding a sixth transparent section of a third opening; and exposing a seventh transparent section of the mask plate and disposing the seventh transparent section of the mask plate corresponding to the first low gray scale sub pixel section of the top panel; a fourth shield plate of the mask plate shielding an eighth transparent section of a fourth opening.

Moreover, in the step of emitting an ultraviolet along a first incident direction by the mask plate for exposing a top alignment film of the top panel and a bottom alignment film of the bottom panel, the ultraviolet passes through the first transparent section, the third transparent section of the mask plate along the first incident direction to the bottom panel; the ultraviolet passes through the fifth transparent section, the seventh transparent section of the mask plate along the first incident direction to the top panel.

Moreover, in the step of adjusting the transparent section of the mask plate, the photo-alignment method further comprises:

exposing the second transparent section of the mask plate and disposing the second transparent section of the mask plate corresponding to the second high gray scale sub pixel section of the bottom panel; the first shield plate of the mask plate shielding the first transparent section of the first opening;

exposing the fourth transparent section of the mask plate and disposing the fourth transparent section of the mask plate corresponding to the second low gray scale sub pixel section of the bottom panel; the second shield plate of the mask plate shielding the third transparent section of the second opening;

exposing the sixth transparent section of the mask plate and disposing the sixth transparent section of the mask plate corresponding to the second high gray scale sub pixel section of the top panel; the third shield plate of the mask plate shielding the fifth transparent section of the third opening; and exposing the eighth transparent section of the mask plate and disposing the eighth transparent section of the mask plate corresponding to the second low gray scale sub pixel section of the top panel; the fourth shield plate of the mask plate shielding the seventh transparent section of the fourth opening.

Moreover, in the step of emitting an ultraviolet along a second incident direction by the mask plate for exposing a top alignment film of the top panel and a bottom alignment film of the bottom panel, the ultraviolet passes through the second transparent section, the fourth transparent section of the mask plate along the first incident direction to the bottom panel; the ultraviolet passes through the sixth transparent section, the eighth transparent section of the mask plate along the first incident direction to the top panel.

A mask plate, wherein the mask plate comprises a light shielding plate, a first opening, a second opening, a third opening and a fourth opening, the first opening, the second opening, the third opening and the fourth opening are formed at the light shielding plate, the first opening of the mask plate comprises a first transparent section and a second transparent section, the first transparent section and the second transparent section are adjacent with each other, the second opening of the mask plate comprises a third transparent section and a fourth transparent section, the third transparent section and the fourth transparent section are adjacent with each other, the third opening of the mask plate comprises a fifth transparent section and a sixth transparent section, the fifth transparent section and the sixth transparent section are adjacent with each other, the fourth opening of the mask plate comprises a seventh transparent section and an eighth transparent section, the seventh transparent section and the eighth transparent section are adjacent with each other, the mask plate further comprises a first shield plate, a second shield plate, a third shield plate and a fourth shield plate, the first shield plate is configured to shield the first transparent section or the second transparent section, the second shield plate is configured to shield the third transparent section or the fourth transparent section, the third shield plate is configured to shield the fifth transparent section or the sixth transparent section, and the fourth shield plate is configured to shield the seventh transparent section or the eighth transparent section.

A liquid crystal display device, wherein the liquid crystal display device comprises a bottom panel, a top panel and a liquid crystal layer, the liquid crystal layer is disposed between the top panel and the bottom panel; the top panel comprises a top substrate and a top alignment film, the top alignment film is disposed at the top substrate; the bottom panel comprises a bottom substrate and a bottom alignment film, the bottom alignment film is disposed at the bottom substrate, the liquid crystal layer comprises a plurality of liquid crystal molecules, each of the pixel of the liquid crystal display device comprises a high gray scale sub pixel and a low gray scale sub pixel, the high gray scale sub pixel is disposed at the top part, the low gray scale sub pixel is disposed at the bottom part, the high gray scale sub pixel and the low gray scale sub pixel are divided into four adjacent sections, the liquid crystal molecules in the liquid crystal layer in the fourth sections are aligned toward different directions.

Moreover, the angle between the liquid crystal molecule and the long edge of the panel or the angle between the liquid crystal molecule and the short edge of the panel is smaller than 45°.

Moreover, the high gray scale sub pixel of the bottom panel is divided into a first high gray scale sub pixel section and a second high gray scale sub pixel section, the first high gray scale sub pixel section and the second high gray scale sub pixel section are adjacent with each other and are disposed along a long edge of the pixel.

Moreover, the low gray scale sub pixel of the bottom panel is divided into a first low gray scale sub pixel section and a second low gray scale sub pixel section, the first low gray scale sub pixel section and the second low gray scale sub pixel section are adjacent with each other and are disposed along a long edge of the pixel.

Moreover, the high gray scale sub pixel of the top panel is divided into a first high gray scale sub pixel section and a second high gray scale sub pixel section, the first high gray scale sub pixel section and the second high gray scale sub pixel section are adjacent with each other and are disposed along a short edge of the pixel.

Moreover, the low gray scale sub pixel of the top panel is divided into a first low gray scale sub pixel section and a second low gray scale sub pixel section, the first low gray scale sub pixel section and the second low gray scale sub pixel section are adjacent with each other and are disposed along a short edge of the pixel.

According to the mask plate and the photo-alignment method using the same of the disclosure, the first shield plate, second shield plate, third shield plate and fourth shield plate are movably disposed, so that the mask plate is reusable. Thus, the quantity of the mask plate disposed during the process of photo-aligning to the alignment film, so that the cost of the process is decreased. In addition, the bottom panel and the top panel are disposed, and the alignment film of the bottom panel and the top panel are exposed by the mask plate at the same time. Therefore, the manufacture of the alignment film in the whole liquid crystal display device can be accomplished by a mask plate undergoing exposure twice, so that the number of the exposure process can be decreased, and the process is simplified.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION OF THE PREFERRED EMBODIMENTS

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

According to an embodiment of the disclosure, a mask plate and a photo-alignment method using the same for aligning a liquid crystal display device.

Figure 1:
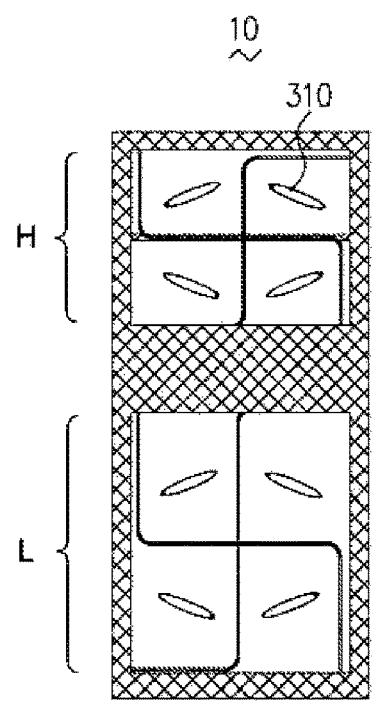
FIG. 1 is a schematic view of the liquid crystal display device according to an embodiment of the disclosure.
Figure 2:
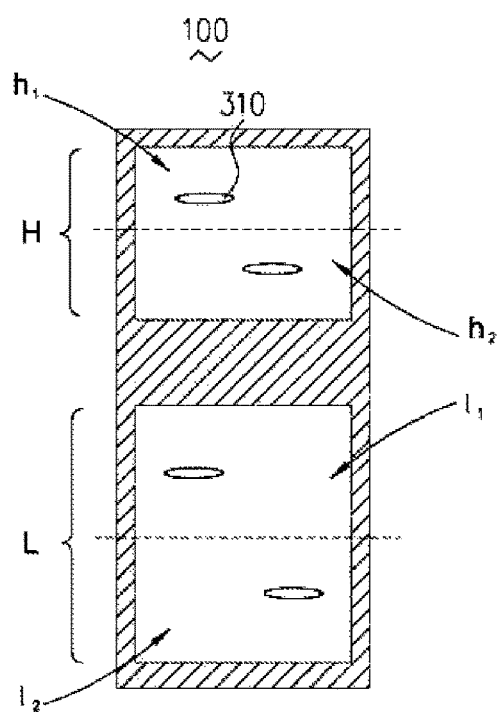
FIG. 2 is a schematic view of the bottom panel of the liquid crystal display device in FIG. 1.
Figure 3:
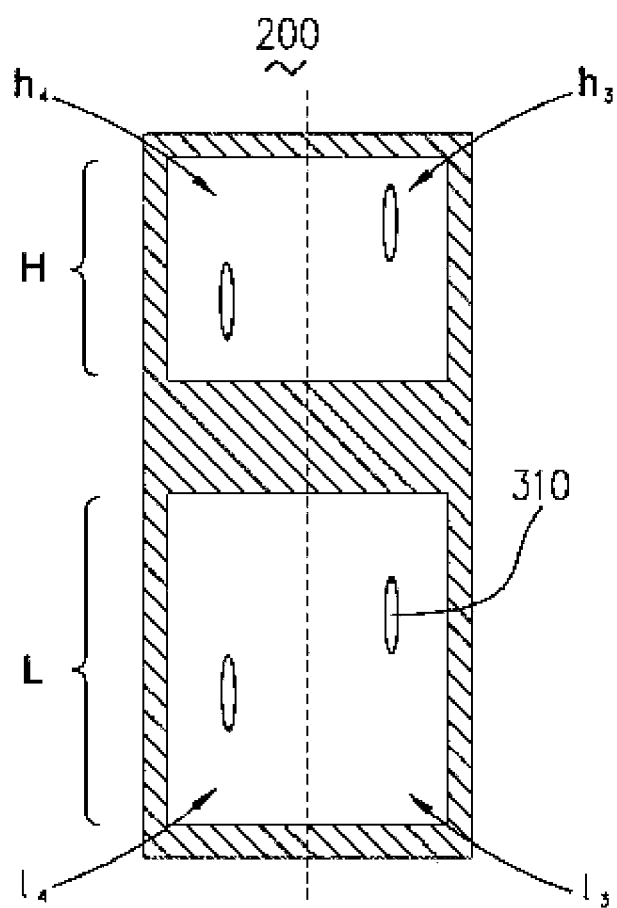
FIG. 3 is a schematic view of the top panel of the liquid crystal display device in FIG. 1.

Referring to FIGS. 1-3, a liquid crystal display device comprises a bottom panel 100, a top panel 200 and a liquid crystal layer (not shown), the liquid crystal layer is disposed between the top panel 200 and the bottom panel 100; the top panel 200 comprises a top substrate and a top alignment film (not shown), the top alignment film is disposed at the top substrate; the bottom panel 100 comprises a bottom substrate and a bottom alignment film (not shown), the bottom alignment film is disposed at the bottom substrate. The liquid crystal layer comprises a plurality of liquid crystal molecules 310. The mask plate is configured to expose the alignment film of the top panel and the bottom panel.

FIG. 1 represents a part view of a pixel 10 in the liquid crystal display device. The pixel 10 of the liquid crystal display device comprises a high gray scale sub pixel H and a low gray scale sub pixel L, the high gray scale sub pixel H is disposed at the top part, and the low gray scale sub pixel L is disposed at the bottom part. The high gray scale sub pixel H and the low gray scale sub pixel L are disposed along a long edge of the pixel. The high gray scale sub pixel H and the low gray scale sub pixel L are divided into four adjacent sections. Thus, the structure is 2×2. The liquid crystal molecules in the liquid crystal layer in the four adjacent sections are aligned toward different directions; the angle between the liquid crystal molecule and an edge (the long edge or the short edge) of the panel is smaller than 45°.

As shown in FIG. 2, the high gray scale sub pixel H and the low gray scale sub pixel L of the bottom panel 100 are divided into a left part and a right part. The high gray scale sub pixel H of the bottom panel 100 is divided into a first high gray scale sub pixel section $h_1$ and a second high gray scale sub pixel section $h_2$; and the first high gray scale sub pixel section $h_1$ and the second high gray scale sub pixel section $h_2$ are adjacent with each other and are disposed along a long edge of the pixel 10; the low gray scale sub pixel L of the bottom panel 100 is divided into a first low gray scale sub pixel section $l_1$ and a second low gray scale sub pixel section $l_2$; and the first low gray scale sub pixel section $l_1$ and the second low gray scale sub pixel section $l_2$ are adjacent with each other and are disposed along a long edge of the pixel 10.

In the liquid crystal display device, the high gray scale sub pixel H and the low gray scale sub pixel L of the bottom panel 100 are photo-aligned by the bottom alignment film of the bottom panel 100.

As shown in FIG. 3, the high gray scale sub pixel H and the low gray scale sub pixel L of the top panel 200 are divided into a left part and a right part. The high gray scale sub pixel H of the top panel 200 is divided into a first high gray scale sub pixel section $h_3$ and a second high gray scale sub pixel section $h_4$; and the first high gray scale sub pixel section $h_3$ and the second high gray scale sub pixel section $h_4$ are adjacent with each other and are disposed along a short edge of the pixel 10; the low gray scale sub pixel L of the top panel 200 is divided into a first low gray scale sub pixel section $l_3$ and a second low gray scale sub pixel section $l_4$; and the first low gray scale sub pixel section $l_3$ and the second low gray scale sub pixel section $l_4$ are adjacent with each other and are disposed along a short edge of the pixel 10.

In the liquid crystal display device, the high gray scale sub pixel H and the low gray scale sub pixel L of the top panel 200 are photo-aligned by the top alignment film of the top panel 200.

By the mask plate 400 shielding the bottom panel 100 or the top panel 200, and the exposure to the bottom alignment film of the bottom panel 100 or the top alignment film of the top panel 200, the bottom alignment film of the bottom panel 100 and the top alignment film of the top panel 200 are aligned as FIG. 1.

During the process of photo-alignment for aligning the top alignment film or the bottom alignment film, the mask plate 40 shields the bottom panel 100 or the top panel 20

Figure 4:
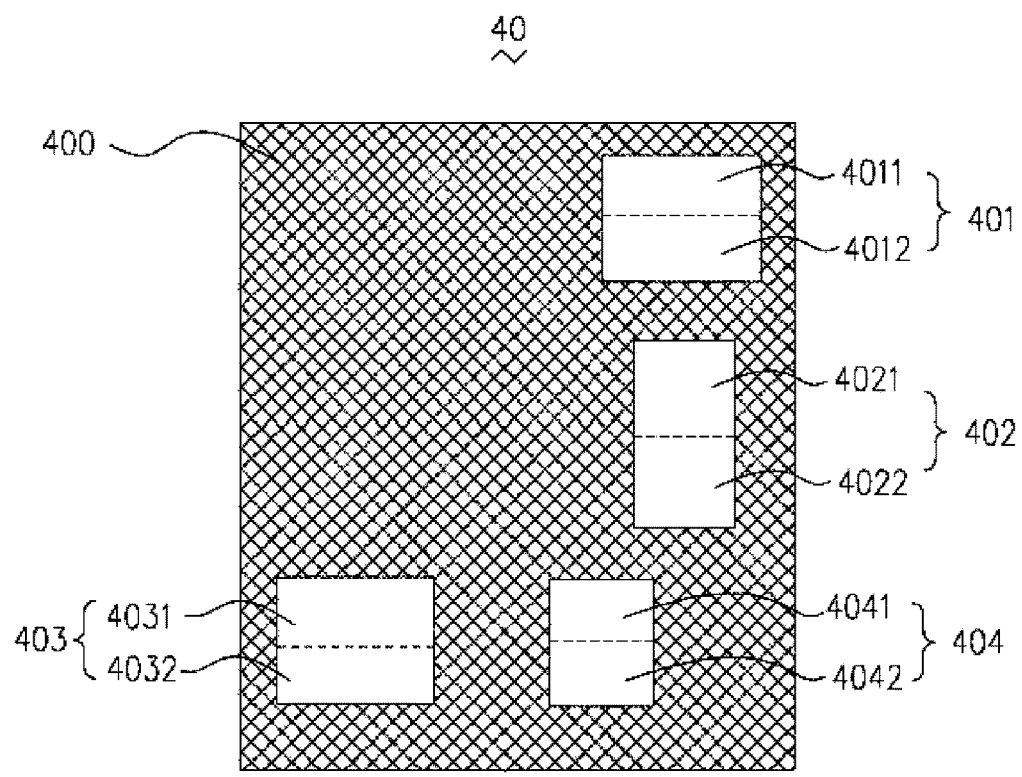
FIG. 4 is a schematic view of the light shielding plate of the mask plate according to another embodiment of the disclosure.

Referring to FIG. 4, the disclosure further provides a mask plate 40 for the photo-alignment method. The mask plate 40 comprises a light shielding plate 400, a first opening 401, a second opening 402, a third opening 403 and a fourth opening 404, and the first opening 401, the second opening 402, the third opening 403 and the fourth opening 404 are formed at the light shielding plate 400. The first opening 401 of the mask plate 40 comprises a first transparent section 4011 and a second transparent section 4012, and the first transparent section 4011 and the second transparent section 4012 are adjacent with each other. The second opening 402 of the mask plate 40 comprises a third transparent section 4021 and a fourth transparent section 4022, and the third transparent section 4021 and the fourth transparent section 4022 are adjacent with each other. The third opening 403 of the mask plate 40 comprises a fifth transparent section 4031 and a sixth transparent section 4032, and the fifth transparent section 4031 and the sixth transparent section 4032 are adjacent with each other. The fourth opening 404 of the mask plate 40 comprises a seventh transparent section 4041 and an eighth transparent section 4042, and the seventh transparent section 4041 and the eighth transparent section 4042 are adjacent with each other.

Figure 5:
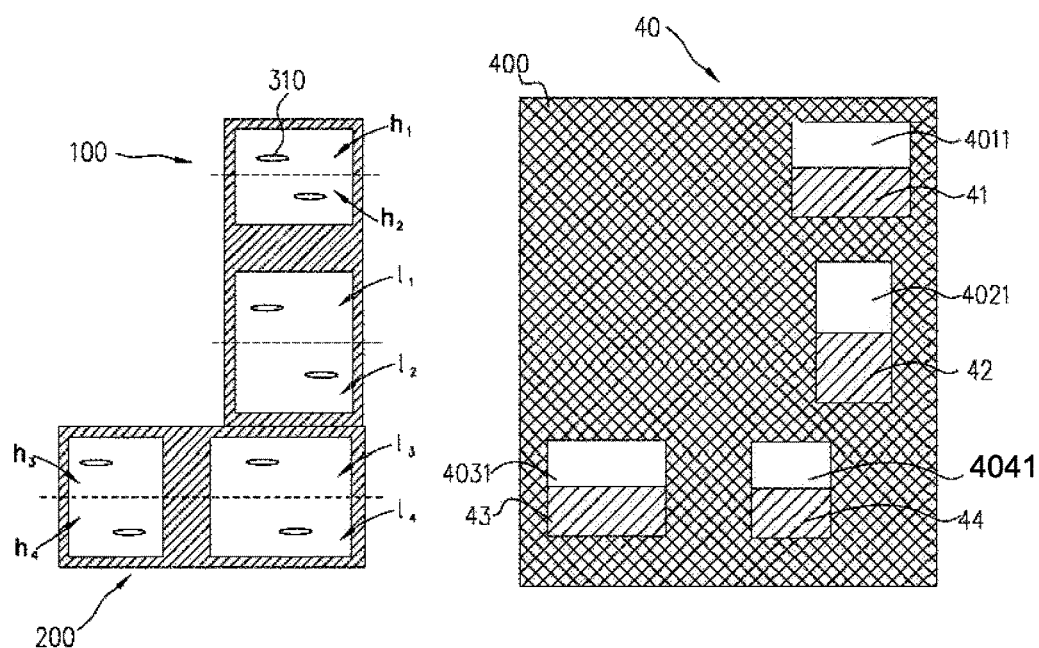
FIGS. 5 and 6 are schematic views of the top panel, the bottom panel and the mask plate according to another embodiment of the disclosure.
Figure 6:
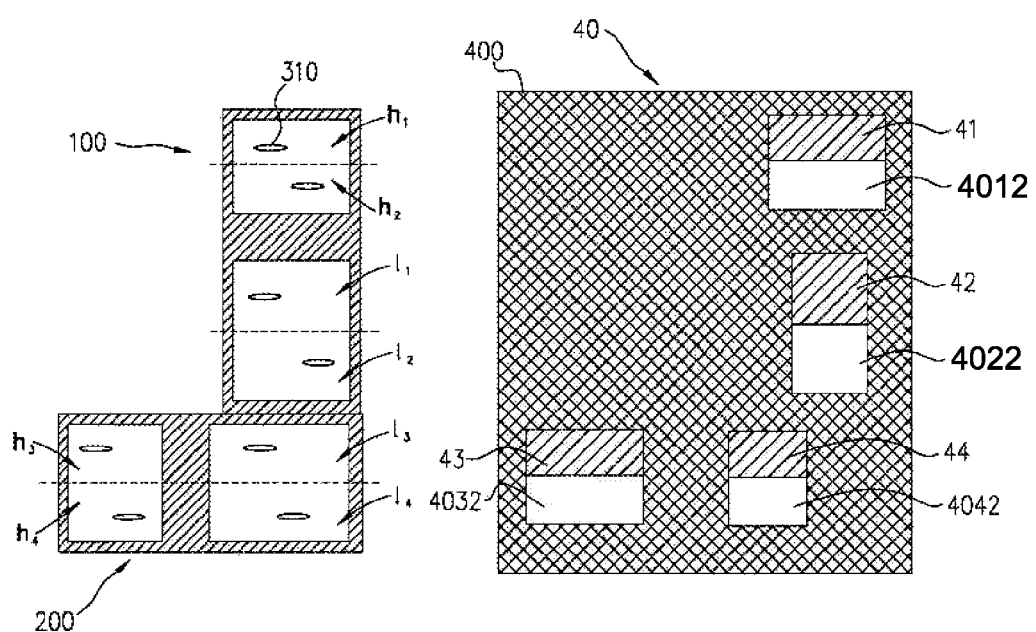

Referring to FIGS. 5-6, the mask plate 40 further comprises a first shield plate 41, and the first shield plate 41 is capable of moving in the first opening 401 so as to shield the first transparent section 4011 or the second transparent section 4012. The mask plate 40 further comprises a second shield plate 42, and the second shield plate 42 is capable of moving in the second opening 402 so as to shield the third transparent section 4021 or the fourth transparent section 4022. The mask plate 40 further comprises a third shield plate 43, and the third shield plate 43 is capable of moving in the third opening 403 so as to shield the fifth transparent section 4031 or the sixth transparent section 4032. The mask plate 40 further comprises a fourth shield plate 44, and the fourth shield plate 44 is capable of moving in the fourth opening 404 so as to shield the seventh transparent section 4041 or the eighth transparent section 4042.

In using the mask plate 300 of the disclosure, the first shield plate 41, the second shield plate 42, the third shield plate 43 and the third shield plate 43 are capable of moving in the first opening 401, the second opening 402, the third opening 403 and the fourth opening 404 respectively, so as to shield or expose the first transparent section 4011, the second transparent section 4012, the third transparent section 4021, the fourth transparent section 4022, the fifth transparent section 4031, the sixth transparent section 4032, the seventh transparent section 4041, and the eighth transparent section 4042. Thus, when exposing light for the photo-alignment of the bottom alignment film or the top alignment film, the ultraviolet emitted from the light source 60 is exposed to the corresponding transparent sections for the photo-alignment.

Figure 7:
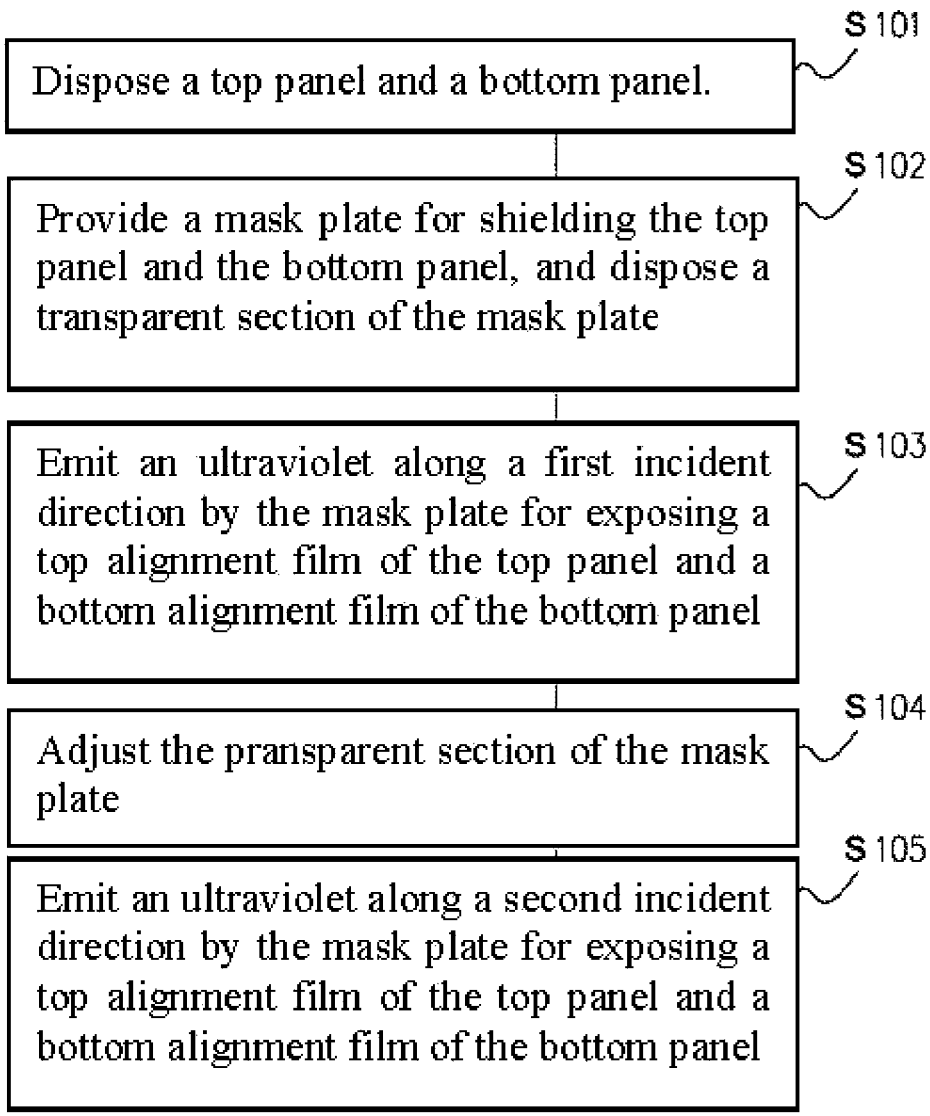
FIG. 7 is a flow chart of the photo-alignment method according to another embodiment of the disclosure.

As shown in FIG. 7, the disclosure further provides a photo-alignment method, comprising the following steps:

Step S101, providing a top panel 200 and a bottom panel 100.

This step further comprises the following steps:

Step S1011, dividing a high gray scale sub pixel H at the bottom panel 100 into a first high gray scale sub pixel section $h_1$ and a second high gray scale sub pixel section $h_2$, wherein the first high gray scale sub pixel section $h_1$ is adjacent to the second high gray scale sub pixel section $h_2$, and the first high gray scale sub pixel section $h_1$ and the second high gray scale sub pixel section $h_2$ are disposed along a long edge of a pixel 10, and dividing a low gray scale sub pixel L at the bottom panel 100 into a first low gray scale sub pixel section $l_1$ and a second low gray scale sub pixel section $l_2$, wherein the first low gray scale sub pixel section $l_1$ is adjacent to the second low gray scale sub pixel section $l_2$, and the first low gray scale sub pixel section $l_1$ and the second low gray scale sub pixel section $l_2$ are disposed along a long edge of a pixel 10;

Step S1012, dividing a high gray scale sub pixel H at the top panel into a first high gray scale sub pixel section $h_3$ and a second high gray scale sub pixel section $h_4$, wherein the first high gray scale sub pixel section $h_3$ is adjacent to the second high gray scale sub pixel section $h_4$, and the first high gray scale sub pixel section $h_3$ and the second high gray scale sub pixel section $h_4$ are disposed along a short edge of a pixel 10, and dividing a low gray scale sub pixel L at the top panel 200 into a first low gray scale sub pixel section $l_3$ and a second low gray scale sub pixel section $l_4$, wherein the first low gray scale sub pixel section $l_3$ is adjacent to the second low gray scale sub pixel section $l_4$, and the first low gray scale sub pixel section $l_3$ and the second low gray scale sub pixel section $l_4$ are disposed along a short edge of a pixel 10; and S1013, disposing the top panel 200 and the bottom panel 100 so that the top panel 200 and the bottom panel 100 are vertical to each other.

S102, providing a mask plate 40 for shielding the top panel 200 and the bottom panel 100, and disposing a transparent section of the mask plate 40.

Figure 8:
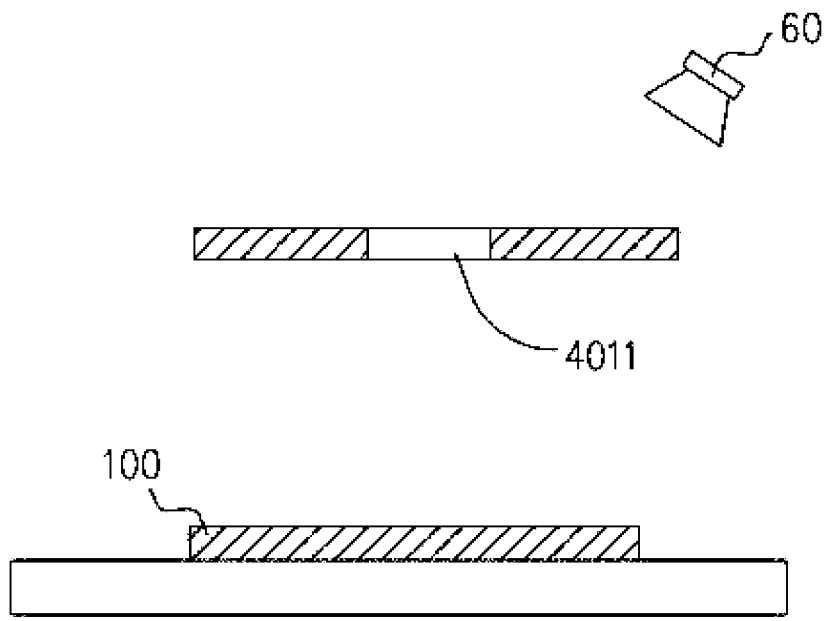
FIGS. 8-13 are sectional views of the mask plate during the process of aligning the mask plate.
Figure 9:
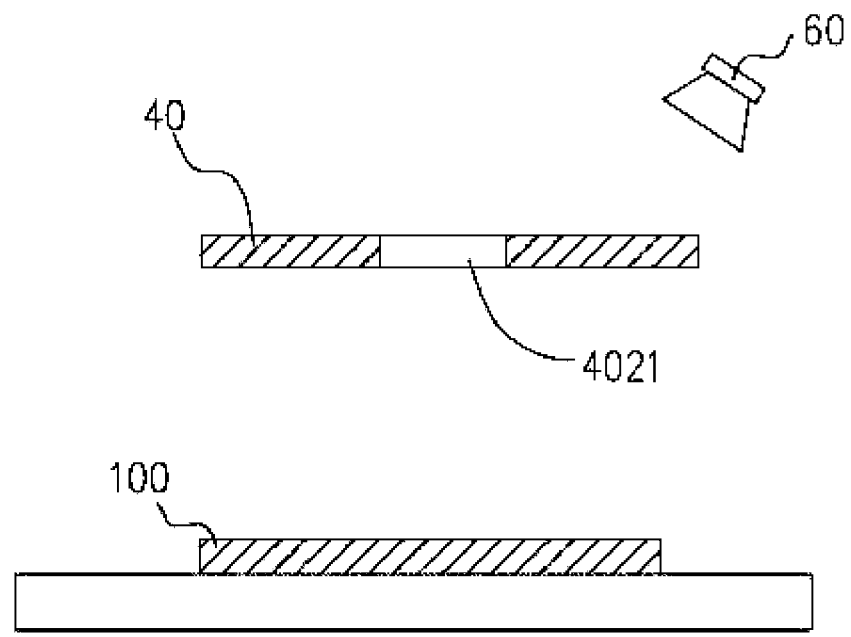
Figure 10:
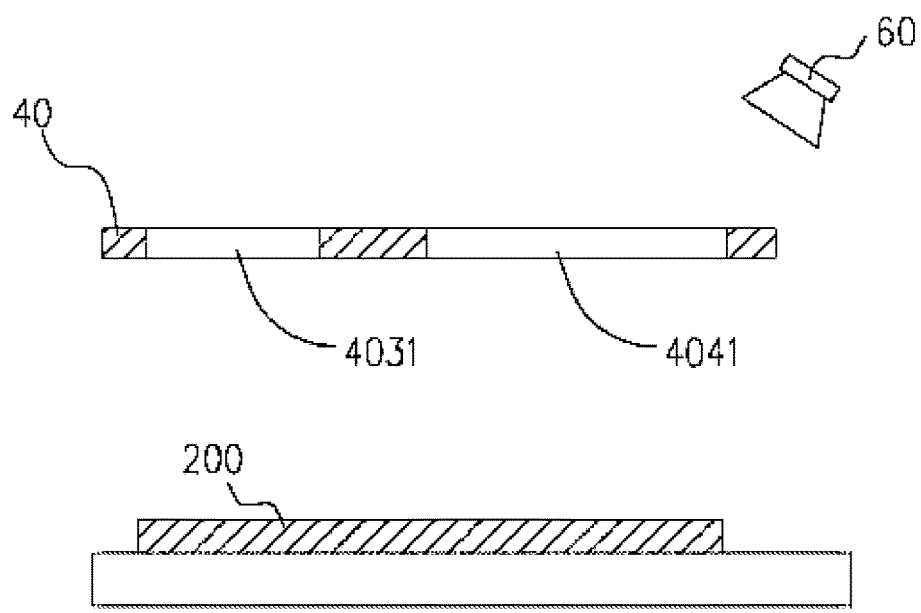
Figure 11:
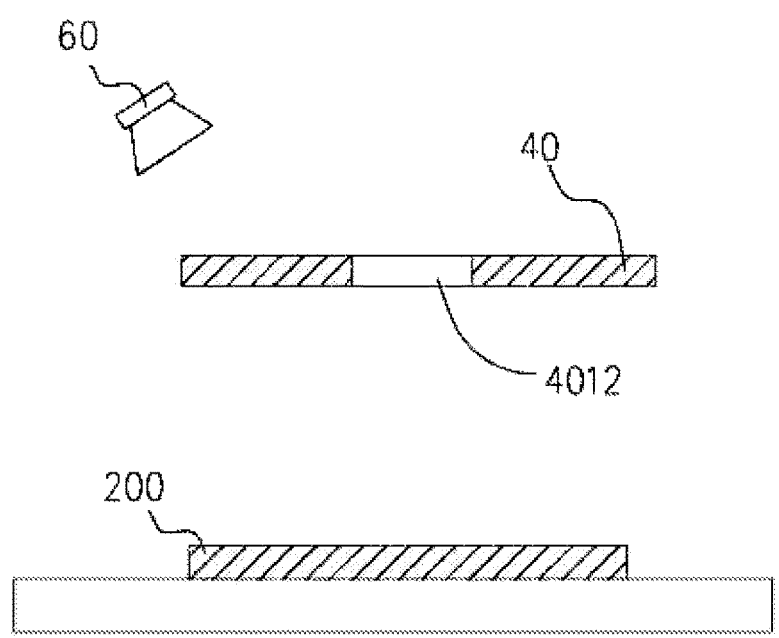

This step further comprises the following steps:

Step S1021, as shown in FIG. 8, exposing a first transparent section 4011 of the mask plate 40 and disposing the first transparent section 4011 of the mask plate 40 corresponding to the first high gray scale sub pixel section $h_1$ of the bottom panel 100; a first shield plate 41 of the mask plate 40 shielding a second transparent section 4012 of a first opening 401;

Step S1022, as shown in FIG. 9, exposing a third transparent section 4021 of the mask plate 40 and disposing the third transparent section 4021 of the mask plate 40 corresponding to the first low gray scale sub pixel section $l_1$ of the bottom panel 100; a second shield plate 42 of the mask plate 40 shielding a fourth transparent section 4022 of a second opening 402;

Step S1023, as shown in FIG. 10, exposing a fifth transparent section 4031 of the mask plate 40 and disposing the fifth transparent section 4031 of the mask plate 40 corresponding to the first high gray scale sub pixel section $h_3$ of the top panel 200; a third shield plate 43 of the mask plate 40 shielding a sixth transparent section 4032 of a third opening 403; and Step S1024, as shown in FIG. 11, exposing a seventh transparent section 4041 of the mask plate 40 and disposing the seventh transparent section 4031 of the mask plate 40 corresponding to the first low gray scale sub pixel section $l_3$ of the top panel 200; a fourth shield plate 44 of the mask plate 40 shielding an eighth transparent section 4042 of a fourth opening 404.

In step S102, when the mask plate 40 is used for masking, the top panel 200 and the bottom panel 100 move corresponding to the mask plate 40. Thus, the mask plate 40 is disposed at an appropriate position between the top panel 200, the bottom panel 100 and the light source 60. Moreover, when masking, the top panel 200 and the bottom panel 100 move toward the mask plate 40. In some other embodiments, the top panel 200 and the bottom panel 100 are fixed, and the mask plate 40 moves toward the top panel 200 and the bottom panel 100.

Step S103, emitting an ultraviolet along a first incident direction by the mask plate 40 for exposing a top alignment film of the top panel 200 and a bottom alignment film of the bottom panel 100.

In this step, the light source 60 emits the ultraviolet along the first incident direction, the ultraviolet passes through the first transparent section 4011 and the third transparent 4021 of the mask plate 40 toward the bottom panel 100, the light source 60 emits the ultraviolet along the first incident direction, the ultraviolet passes through the fifth transparent section 4031 and the seventh transparent 4041 of the mask plate 40 toward the top panel 200, so that the alignment films of the first high gray scale sub pixel $h_1$ and the first low gray scale sub pixel section $I_1$ of the top panel 200 as well as the first high gray scale sub pixel $h_3$ and the first low gray scale sub pixel section $l_3$ of the bottom panel 100 are aligned with the same direction of the first incident direction of the ultraviolet. Moreover, the explanations for the alignment of the light source 60 to the top alignment film and the bottom alignment film are the same, so the disclosure does not describe further details.

Step S104, adjusting the transparent section of the mask plate.

Figure 12:
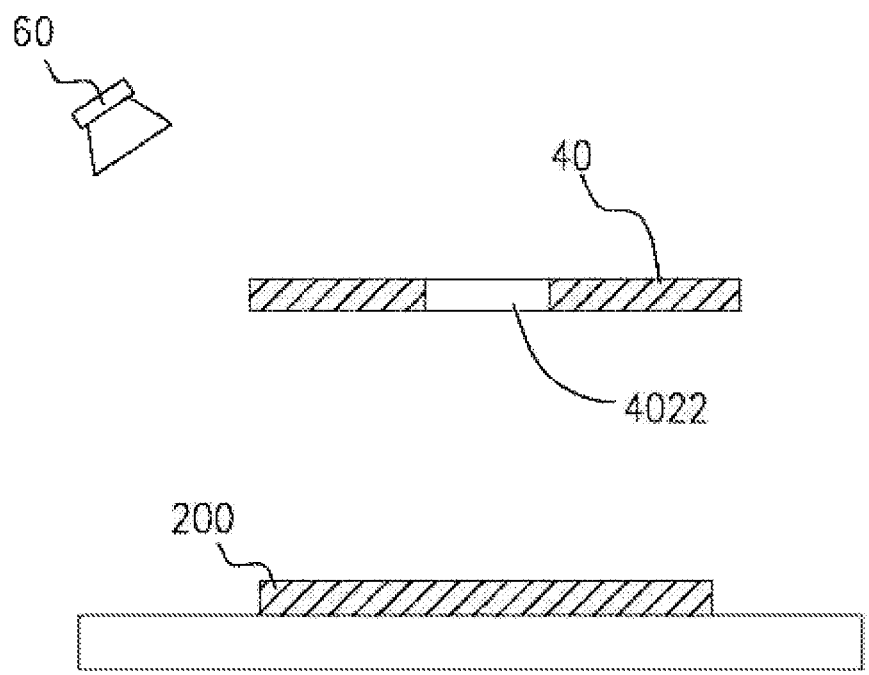
Figure 13:
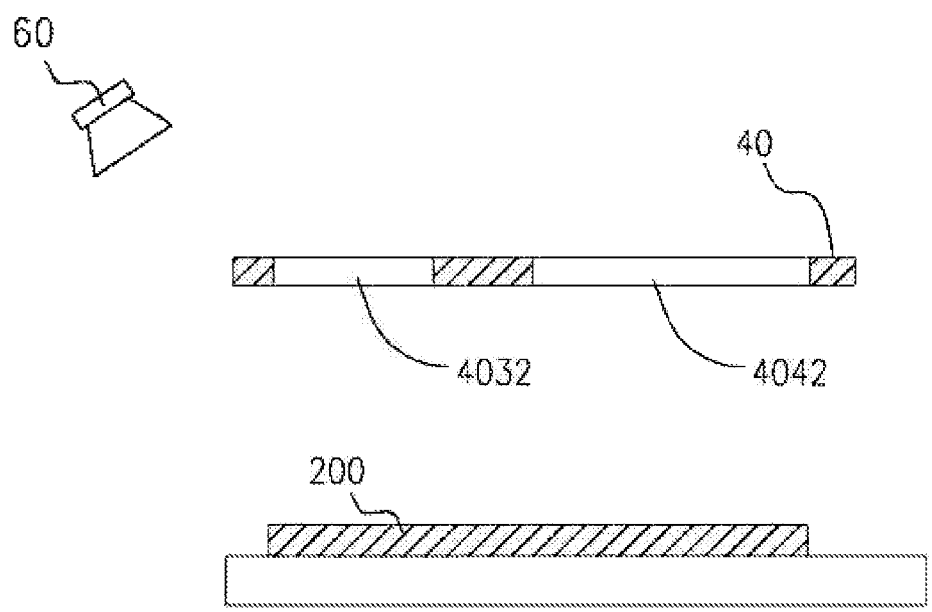

This step further comprises the following steps:

Step S1041, as shown in FIG. 11, exposing the second transparent section 4012 of the mask plate 40 and disposing the second transparent section 4012 of the mask plate 40 corresponding to the second high gray scale sub pixel section $h_2$ of the bottom panel 100; the first shield plate 41 of the mask plate 40 shielding the first transparent section 4011 of the first opening 401;

Step S1042, as shown in FIG. 12, exposing the fourth transparent section 4022 of the mask plate 40 and disposing the fourth transparent section 4022 of the mask plate 40 corresponding to the second low gray scale sub pixel section $l_2$ of the bottom panel 100; the second shield plate 42 of the mask plate 40 shielding the third transparent section 4021 of the second opening 402;

Step S1043, as shown in FIG. 13, exposing the sixth transparent section 4032 of the mask plate 40 and disposing the sixth transparent section 4032 of the mask plate 40 corresponding to the second high gray scale sub pixel section $h_4$ of the top panel 200; the third shield plate 43 of the mask plate 40 shielding the fifth transparent section 4031 of the third opening 403; and Step S1044, exposing the eighth transparent section 4042 of the mask plate 40 and disposing the eighth transparent section 4042 of the mask plate 40 corresponding to the second low gray scale sub pixel section $l_4$ of the top panel 200; the fourth shield plate 44 of the mask plate 40 shielding the seventh transparent section 4041 of the fourth opening 404.

Step S105, emitting an ultraviolet along a second incident direction by the mask plate 40 for exposing a top alignment film of the top panel 200 and a bottom alignment film of the bottom panel 100. In this step, the light source 60 emits the ultraviolet along the second incident direction, the ultraviolet passes through the second transparent section 4012 and the fourth transparent section 4022 of the mask plate 40 to the bottom panel 100, the light source 60 emits the ultraviolet along the second incident direction, the ultraviolet passes through the sixth transparent section 4032 and the eighth transparent section 4042 of the mask plate 40 to the top panel 200, so that the second high gray scale sub pixel section $h_2$, the second low gray scale sub pixel section $l_2$ of the top panel 200, as well as the second high gray scale sub pixel section $h_4$, the second low gray scale sub pixel section $l_4$ of the bottom panel 100 are aligned with the same direction of the second incident direction of the ultraviolet.

In step S105, the method is the same with the photo-alignment method in Step S103, the difference is merely the position of the shield plate and the incident direction of the ultraviolet. Thus, each section of the top alignment film of the top panel 200 and the bottom alignment film of the bottom panel 100, which is exposed twice, has different alignment. That is, one pixel 10 has a plurality of sections having different alignment.

According to the mask plate 40 and the photo-alignment method using the same of the disclosure, the first shield plate 41, second shield plate 42, third shield plate 43 and fourth shield plate 44 are movably disposed, so that the mask plate 40 is reusable. Thus, the quantity of the mask plate 40 disposed during the process of photo-aligning to the alignment film, so that the cost of the process is decreased. In addition, the bottom panel 100 and the top panel 200 are disposed, and the alignment film of the bottom panel 100 and the top panel 200 are exposed by the mask plate 40 at the same time. Therefore, the manufacture of the alignment film in the whole liquid crystal display device can be accomplished by a mask plate 40 undergoing exposure twice, so that the number of the exposure process can be decreased, and the process is simplified.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A mask plate, comprising:
    a light shielding plate, which comprises a first opening, a second opening, a third opening and a fourth opening formed in the light shielding plate, wherein the first opening comprises a first transparent section and a second transparent section, which are adjacent to each other; the second opening comprises a third transparent section and a fourth transparent section, which are adjacent to each other; the third opening comprises a fifth transparent section and a sixth transparent section, which are adjacent to each other; and the fourth opening comprises a seventh transparent section and an eighth transparent section, which are adjacent to each other;
    a first shield plate, which is configured to selectively shield the first transparent section or the second transparent section;
    a second shield plate, which is configured to selectively shield the third transparent section or the fourth transparent section;
    a third shield plate, which is configured to selectively shield the fifth transparent section or the sixth transparent section; and
    a fourth shield plate, which is configured to selectively shield the seventh transparent section or the eighth transparent section;
    wherein the first shield plate, the second shield plate, the third shield plate, and the fourth shield plate are separate from each other and are respectively and independently movable in the first opening, the second opening, the third opening, and the fourth opening to respectively and independently shield or expose the first transparent section, the second transparent section, the third transparent section, the fourth transparent section, the fifth transparent section, the sixth transparent section, the seventh transparent section, and the eighth transparent section.

* * * * *